US011621234B2

(12) United States Patent
Caillet et al.

(10) Patent No.: US 11,621,234 B2
(45) Date of Patent: Apr. 4, 2023

(54) CHIP TAMPERING DETECTOR

(71) Applicant: SEMICONDUCTOR COMPONENTS INDUSTRIES, LLC, Phoenix, AZ (US)

(72) Inventors: Regis Caillet, Bevaix (CH); Lionel Charmillot, Les Geneveys (CH)

(73) Assignee: SEMICONDUCTOR COMPONENTS INDUSTRIES, LLC, Scottsdale, AZ (US)

( * ) Notice: Subject to any disclaimer, the term of this patent is extended or adjusted under 35 U.S.C. 154(b) by 8 days.

(21) Appl. No.: 16/832,948

(22) Filed: Mar. 27, 2020

(65) Prior Publication Data
US 2021/0305177 A1    Sep. 30, 2021

(51) Int. Cl.
*H01L 23/00* (2006.01)
*H05K 1/16* (2006.01)
*H05K 1/02* (2006.01)
*H01L 49/02* (2006.01)

(52) U.S. Cl.
CPC .......... *H01L 23/576* (2013.01); *H01L 23/573* (2013.01); *H01L 28/86* (2013.01); *H05K 1/0275* (2013.01); *H05K 1/162* (2013.01)

(58) Field of Classification Search
CPC ..... H01L 23/576; H01L 28/86; H01L 23/573; H05K 1/0275; H05K 1/162
See application file for complete search history.

(56) References Cited

U.S. PATENT DOCUMENTS

| | | | | |
|---|---|---|---|---|
| 5,861,652 A | * | 1/1999 | Cole | G11C 7/24 257/908 |
| 2006/0044138 A1 | | 3/2006 | Sin | |
| 2008/0237792 A1 | * | 10/2008 | Kang | H01L 27/0805 257/532 |
| 2010/0026313 A1 | * | 2/2010 | Bartley | H01L 23/576 324/548 |
| 2010/0026506 A1 | * | 2/2010 | Bartley | H01L 23/576 340/657 |
| 2019/0089030 A1 | * | 3/2019 | Song | H01L 28/20 |
| 2019/0325171 A1 | * | 10/2019 | Obermaier | G06F 21/73 |
| 2020/0043874 A1 | * | 2/2020 | Sira | H01L 23/66 |
| 2021/0119791 A1 | * | 4/2021 | Kim | G06F 21/64 |

FOREIGN PATENT DOCUMENTS

EP    2573716 A2    3/2013

* cited by examiner

*Primary Examiner* — Reema Patel
(74) *Attorney, Agent, or Firm* — Brake Hughes Bellermann LLP

(57) ABSTRACT

A chip tampering detector is disclosed. The chip tampering detector includes a plurality of resistor-capacitor circuits. Each resistor-capacitor circuit includes a capacitor having a planar area that covers a sensitive area of an integrated circuit of the chip. The resistor-capacitor circuits can be probed with an input signal to generate output signals. The output signals can be measured to determine respective time-constants resistor-capacitor circuits. Tampering with a chip can alter the capacitance of a capacitor covering a sensitive area. Accordingly, a significant change of a time-constant of one or more of the resistor-capacitor circuits can be used to detect chip tampering.

18 Claims, 9 Drawing Sheets

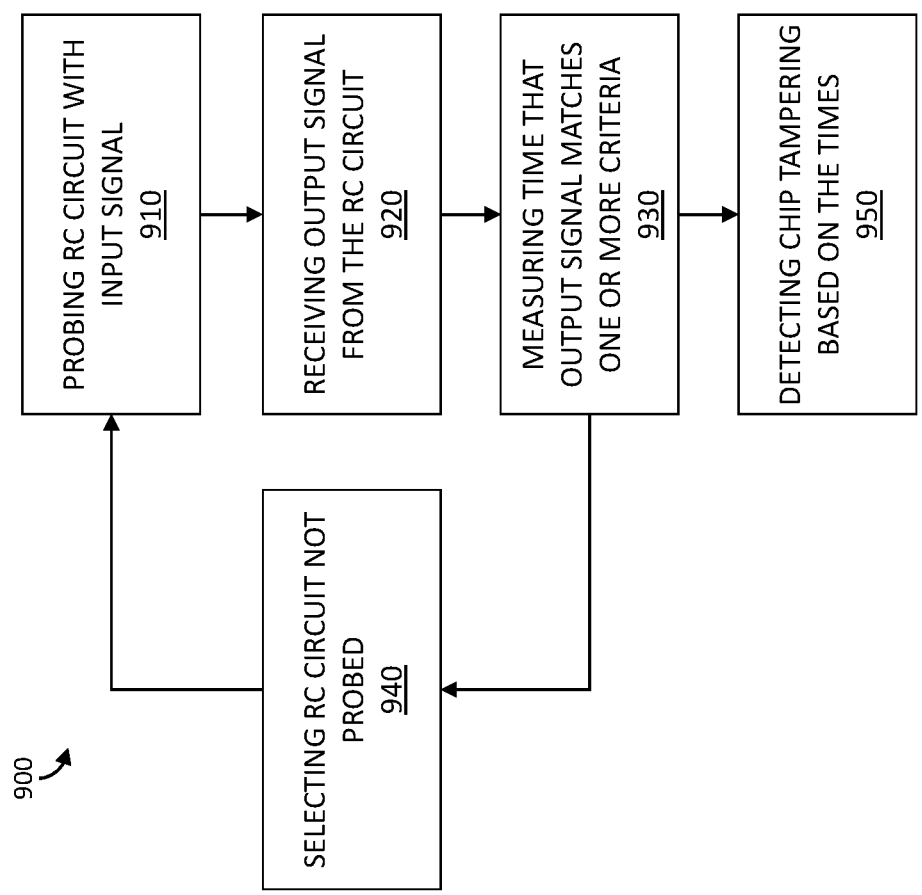

US 11,621,234 B2

CHIP TAMPERING DETECTOR

FIELD OF THE DISCLOSURE

The present disclosure relates to microelectronic circuits and more specifically to a circuit and method for detecting tampering of an integrated circuit (IC).

BACKGROUND

Tampering of an IC (i.e., chip tampering) may include deliberately altering portions of the chip. The alteration may include the use of tools (e.g., drills, files, etc.) or chemicals (e.g., solvents, etchants, etc.) to remove material (e.g., packaging) in order to expose underlying circuitry. Once exposed, the circuitry (e.g., microprocessor, memory, logic, etc.) may be electrically probed to sense signals and determine sensitive information (e.g., keys, credentials, crypto currency, etc.). For example, by sensing signals in the exposed circuitry, it may be possible to determine hardware and/or software security measures used by the chip. Once known, hacks may be developed to circumvent the security measures on the chip or on other similar chips. In another example, by sensing signals in the exposed circuitry, it may be possible to obtain a key for encryption or communication. Once known, the key may be reused to obtain access to the data and/or communication. Anti-tampering measures can be taken to detect and subsequently protect the chip from tampering. For example, when tampering is detected, a chip may be configured to change/delete the sensitive information (i.e., data). For this purpose and others, it may be important to provide a means for detecting tampering that is sensitive and resistant to being circumvented. It is in this context that implementations of the disclosure arise.

SUMMARY

In at least one aspect, the present disclosure generally describes a chip (i.e., microchip). The chip includes an integrated circuit that is disposed on a first chip layer. The chip further includes a resistor-capacitor circuit that includes a capacitor disposed on a second chip layer. The capacitor on the second chip layer covers a portion of the integrated circuit on the first chip layer. The capacitor is configured to change a time-constant of the resistor-capacitor circuit when it is physically altered (e.g., by chip tampering).

In another aspect, the present disclosure generally describes a method for detecting chip tampering. The method includes probing a resistor-capacitor circuit that includes a capacitor covering a portion of an integrated circuit with an input signal. The method further includes receiving an output signal from the resistor-capacitor circuit. The method further includes measuring a time that the output signal matches at least one criterion. The time corresponds to a time-constant of the resistor-capacitor circuit. The method includes detecting chip tampering based on the time (i.e., because the time corresponds to the time constant and the time-constant can be changed from an initial value by tampering with the capacitor).

In another aspect, the present disclosure generally describes a system (i.e., anti-tampering system). The system includes an integrated circuit and a plurality of resistor-capacitor circuits. Each of the resistor-capacitor circuits includes a capacitor that covers a portion of the integrated circuit. Each capacitor is configured to change a time-constant of a corresponding resistor-capacitor circuit when it is physically altered. The system further includes a driver circuit that is configured to apply an input signal to each resistor-capacitor circuit and a counter circuit that is configured to measure times that each output signal from each resistor-capacitor circuit matches one or more criteria (i.e., at least one criterion). The system further includes a processor. The processor is configured by software instructions to detect chip tampering based on the times measured by the counter (e.g., by comparing the times). In one possible implementation, the processor may be further configured to alter (e.g., delete) data (e.g., crypto-keys, passwords, etc.) stored in memory in response to detecting chip tampering.

The foregoing illustrative summary, as well as other exemplary objectives and/or advantages of the disclosure, and the manner in which the same are accomplished, are further explained within the following detailed description and its accompanying drawings.

BRIEF DESCRIPTION OF THE DRAWINGS

FIG. 9 is a flowchart for a method for detecting chip tampering according to an implementation of the present disclosure.

The components in the drawings are not necessarily to scale relative to each other. Like reference numerals designate corresponding parts throughout the several views.

DETAILED DESCRIPTION

The present disclosure describes circuits and methods to detect chip tampering. The disclosed circuits use active detection that is based on a response to an input signal. The active detection can be more sensitive and harder to circumvent than other approaches, such as those that simply use a broken connection to detect tampering. The disclosed chip-tampering detection approach can also protect sensitive portions (i.e., areas) of the integrated circuit while leaving other portions of the integrated circuit unprotected. This targeted protection approach can be less sensitive to false alarms than approaches that attempt to protect the entire integrated circuit. Additionally, this approach may be scalable and can protect as many or as few portions of an integrated circuit as necessary. For example, multiple capacitors can cover different (i.e., mutually exclusive) portions of the integrated circuit. In some implementations, the disclosed chip-tampering detection can be based on a relative comparison rather than based on a comparison to a fixed value. This relative comparison approach can eliminate the need for a preliminary calibration (e.g., factory setting) and may help reduce variations in the chip-tampering detection to circuit conditions (e.g., temperature). The disclosed chip-tampering circuits may be fabricated using process steps already required to produce the integrated circuit. Accordingly, the disclosed chip-tampering circuits may be more cost effective to fabricate than other approaches that utilize additional and/or non-standard process steps.

Figure 1:
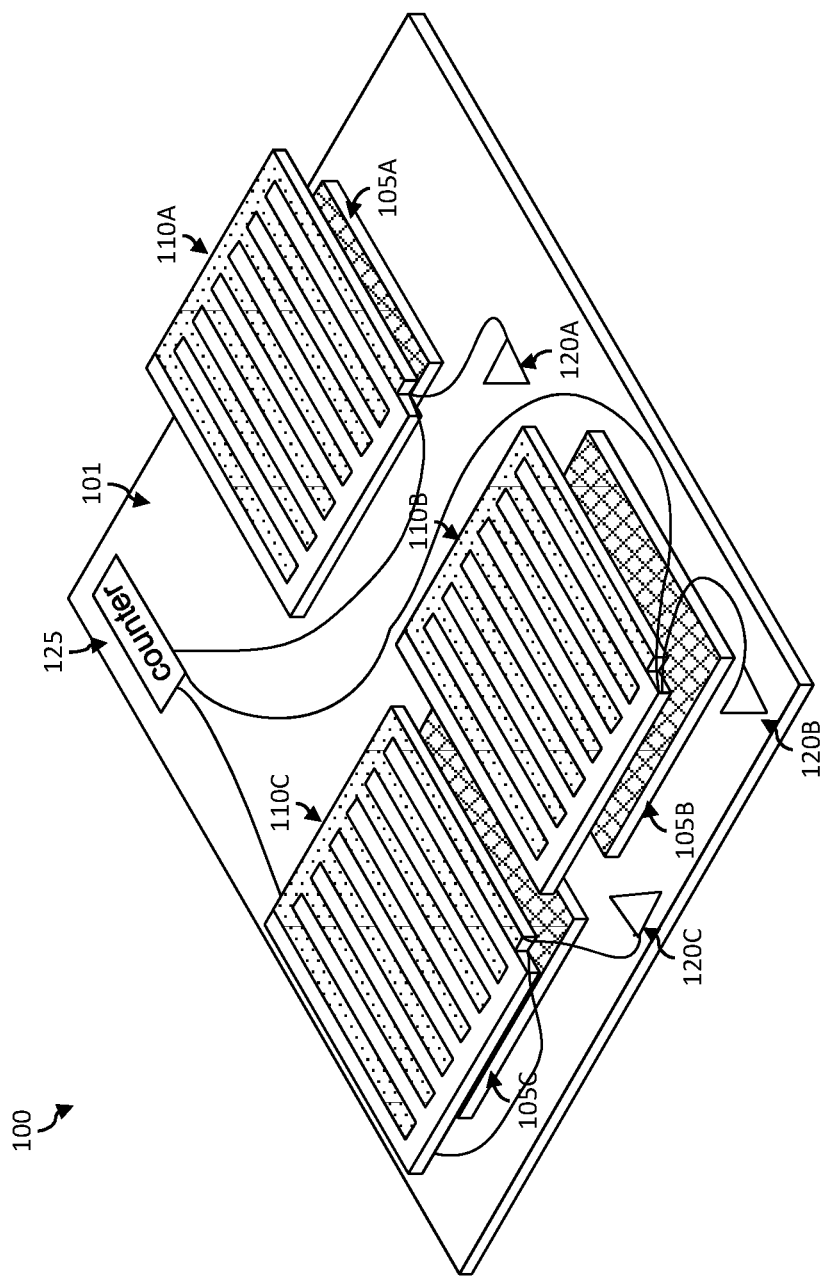
FIG. 1 is a perspective cutaway illustration of a chip that includes an anti-tampering circuit according to a possible implementation of the present disclosure.

FIG. 1 is a perspective cutaway illustration of a chip that includes an anti-tampering circuit. The chip 100 includes an integrated circuit disposed on a first chip layer 101. The integrated circuit on the first chip layer 101 includes portions 105A, 105B, 105C (i.e., sensitive portions) designated for protection (i.e., protected areas). The chip further includes and anti-tampering circuit to protect the portions 105A, 105B, 105C, which includes a resistor-capacitor circuit for each of the portions. Each resistor-capacitor circuit includes a capacitor 110A, 110B, 110C disposed on a second chip layer to cover a respective portion of the integrated circuit. As shown, a resistor capacitor circuit covering a respective portion of the integrated circuit can include a resistor-capacitor circuit being disposed over a portion of the integrated circuit. In other words, covering may include the portion of the integrated circuit being within a footprint of the resistor-capacitor circuit when the footprint of the resistor-capacitor circuit is projected onto the integrated circuit. In some possible implementations, a resistor for each resistor-capacitor circuit is incorporated with the capacitor 110A, 110B, 110C on the second chip layer, while in other possible implementations, the resistor for each resistor-capacitor circuit is incorporated with the integrated circuit on the first chip layer 101.

In a possible implementation, the chip includes one or more (i.e., at least one) driver circuits 120A, 120B, 120C configured to generate and transmit input signals to the inputs of the resistor-capacitor circuits. For example, the integrated circuit on the first chip layer 101 may include the one or more driver circuits 120A, 120B, 120C, as shown in FIG. 1. Additionally, the integrated circuit can include one or more counter circuits. As shown in FIG. 1, a counter circuit 125 is coupled to the outputs of the resistor-capacitor circuits. The counter circuit 125 is configured to measure a time corresponding to an RC-time-constant (i.e., time-constant) of each of the resistor-capacitor circuits based on an output signal from each resistor-capacitor circuit. In a possible implementation, the driver circuits and the counter circuits are controlled to drive (i.e., probe) and measure (i.e., sense) all of the resistor-capacitor circuits in sequence. In another possible implementation, each resistor-capacitor circuit is coupled to a dedicated driver circuit and a dedicated counter circuit. In this implementation, all of the resistor-capacitor circuits may be driven and measured simultaneously (i.e., in parallel). In still another possible implementation, only a subset (e.g., one) of the resistor-capacitor circuits may be driven and measured (i.e., either in sequence or in parallel). For example, when only one portion of an integrated circuit includes sensitive data, then it may only be necessary to drive and measure the resistor-capacitor circuit protecting this one portion.

Figure 2:
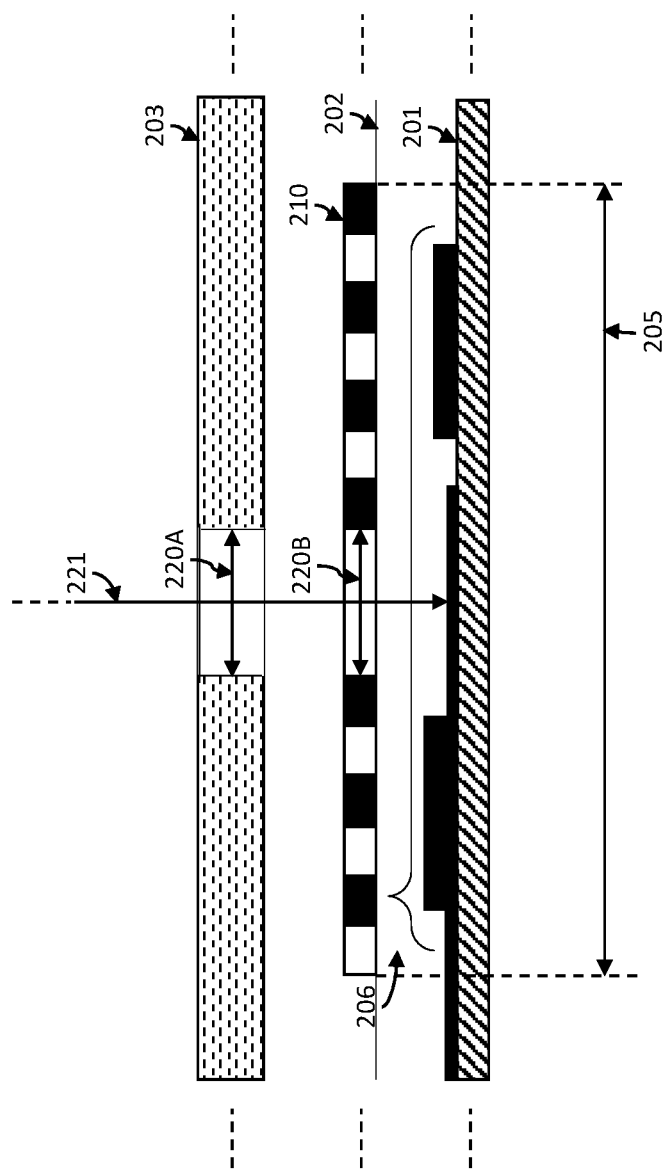
FIG. 2 is a cross-sectional sideview of a portion of a chip including an anti-tampering circuit after tampering according to a possible implementation of the present disclosure.

FIG. 2 is a cross-sectional sideview of a portion of a chip according to a possible implementation of the present disclosure. As described previously, an integrated circuit is disposed on a first chip layer 201. The integrated circuit includes an integrated circuit portion 206 for protection (i.e., protected area, sensitive area, etc.). For example, the integrated circuit portion 206 can include devices (e.g., memory) and/or circuit traces that can be probed to obtain sensitive data (e.g., passwords, keys, etc.) that are stored and/or communicated. The chip may also include a package 203 that contains, protects, and/or supports the integrated circuit.

Chip tampering can include obtaining physical access to the first chip layer 201 in a protected area 205 so that a probe 221 may be brought into contact with a circuit feature (e.g., trace, pad, via, pin, wire, etc.) to couple electrical signals to/from the integrated circuit portion 206. To detect this chip tampering, the chip also includes a second chip layer 202 that includes a capacitor 210. The capacitor 210 covers (e.g., is above) the protected area 205 so that obtaining physical access to the integrated circuit portion 206, requires creating a hole 220A in the package 203 and further creating a hole 220B in the capacitor 210. The hole 220B may change the electrical characteristics (e.g., resistance, capacitance) of the capacitor 210. Accordingly, a change to the electrical characteristics of the capacitor 210 may correspond to chip tampering. Further, a degree of change to the electrical characteristics of the capacitor 210 may correspond to a degree of chip tampering.

Figure 3:
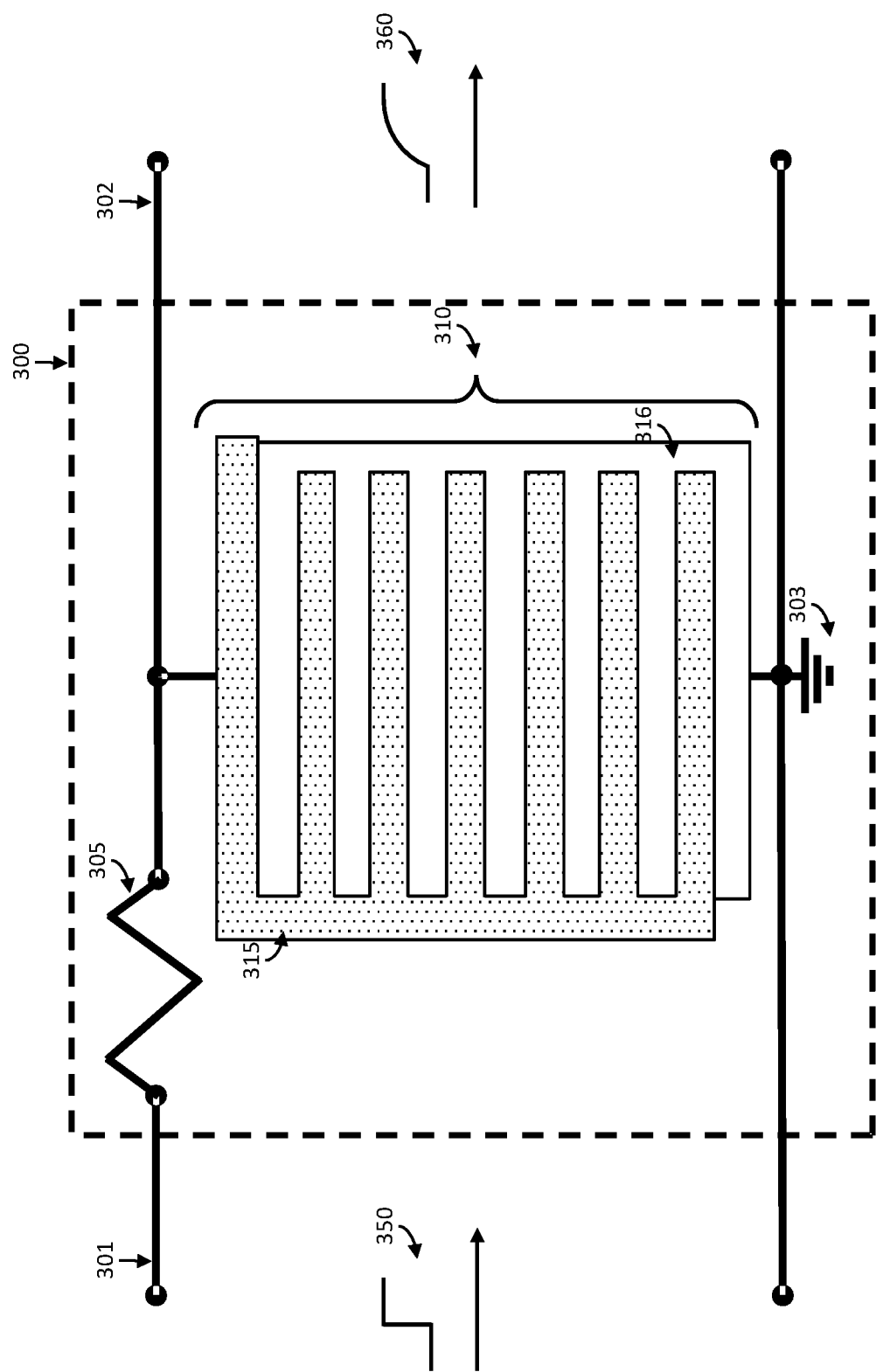
FIG. 3 is a schematic view of a resistor-capacitor circuit including a metal-oxide-metal capacitor according to a possible implementation of the present disclosure.

FIG. 3 is a schematic view of a resistor-capacitor circuit 300 according to a possible implementation of the present disclosure. The resistor-capacitor circuit 300 includes a resistor 305. The resistor 305 is coupled between an input 301 and an output 302 of the resistor-capacitor circuit 300. The resistor may be implemented in a variety of ways. The resistor may be included in the integrated circuit, included in a connection between the integrated circuit and the capacitor, or included as part of the capacitor itself. The resistor-capacitor circuit 300 further includes a capacitor 310. The capacitor includes a first electrode 315 coupled to the output 302 of the resistor-capacitor circuit 300. The capacitor further includes a second electrode 316 that is coupled to a ground voltage 303. The capacitor further includes an insulator between the first electrode 315 and the second electrode 316.

In a possible implementation, the first electrode 315 has a first plurality of finger portions (e.g., horizontal portions as shown in FIG. 3) and the second electrode has a second plurality of finger portions (e.g., horizontal portions as shown in FIG. 3). The first plurality of finger portions and the second plurality of finger portions are interdigitated and within the same plane as each other. The first plurality of finger portions and the second plurality of finger portions have an oxide layer disposed between adjacent finger portions. In other words, the capacitor is a metal-oxide-metal capacitor (i.e., MOM) that has interdigitated electrodes separated by an oxide, such as shown in FIG. 3. The metal-oxide-metal capacitor may advantageously have a planar area that can be sized to cover a particular portion of the first chip layer. The resistor-capacitor circuit may be referred to as an R-MOM when the resistor-capacitor circuit includes a metal-oxide-metal capacitor.

The present disclosure is not limited to the inter-digitated finger implementation of the MOM because there a many possible planar configurations of a first electrode and a second electrode separated by an oxide that can be used as a capacitor in the resistor-capacitor circuit 300. For example, a planar spiral (e.g., square spiral) having two electrodes separated by an oxide may form a MOM. In another example, a pair of planar, concentric electrodes having the same shape (e.g., square, rectangular, triangular, circular, etc.) that are separated by an oxide may form a MOM.

The resistor-capacitor circuit can be probed with an input signal 350 to generate a corresponding output signal 360, which can be characterized by its shape. For example, the input signal may be a step function while the output signal may be a low pass filtered (e.g., delayed) version of the step function (i.e., an RC step response). For example, if the input signal is a voltage that steps from zero volts (i.e., LOW) to a voltage (Vs) (i.e., HIGH), then the output signal (Vout) may be given by the equation below.

$$V_{out} = V_s(1 - e^{-t/RC}) \quad (1)$$

A time-constant of the resistor-capacitor circuit can be defined as the time that it takes (from the step transition of the input signal) for the output signal to reach 63.2 percent (i.e., $1 - \exp(-1) \times 100\%$) of its maximum value. That is, the time-constant of the resistor-capacitor circuit is the resistance (R) multiplied with the capacitance (C) (i.e., time-constant=RC) Accordingly, a change in the capacitance and/or the resistance of the resistor-capacitor circuit due to the tampering described previously may be sensed as a corresponding change in the time necessary for the output signal to meet these criteria (i.e., may be sensed as a change in the time-constant). The criteria (e.g., thresholds) used for measuring the time corresponding to the time-constant may vary with implementation and are not limited to the criteria mentioned above. Additionally, the input signal may be other than the step-function described above. For example, the input signal may be an impulse (e.g., voltage pulse) and the counter may measure the time it takes (from the impulse) for the output signal to decay to a threshold value (e.g., voltage).

Figure 4:
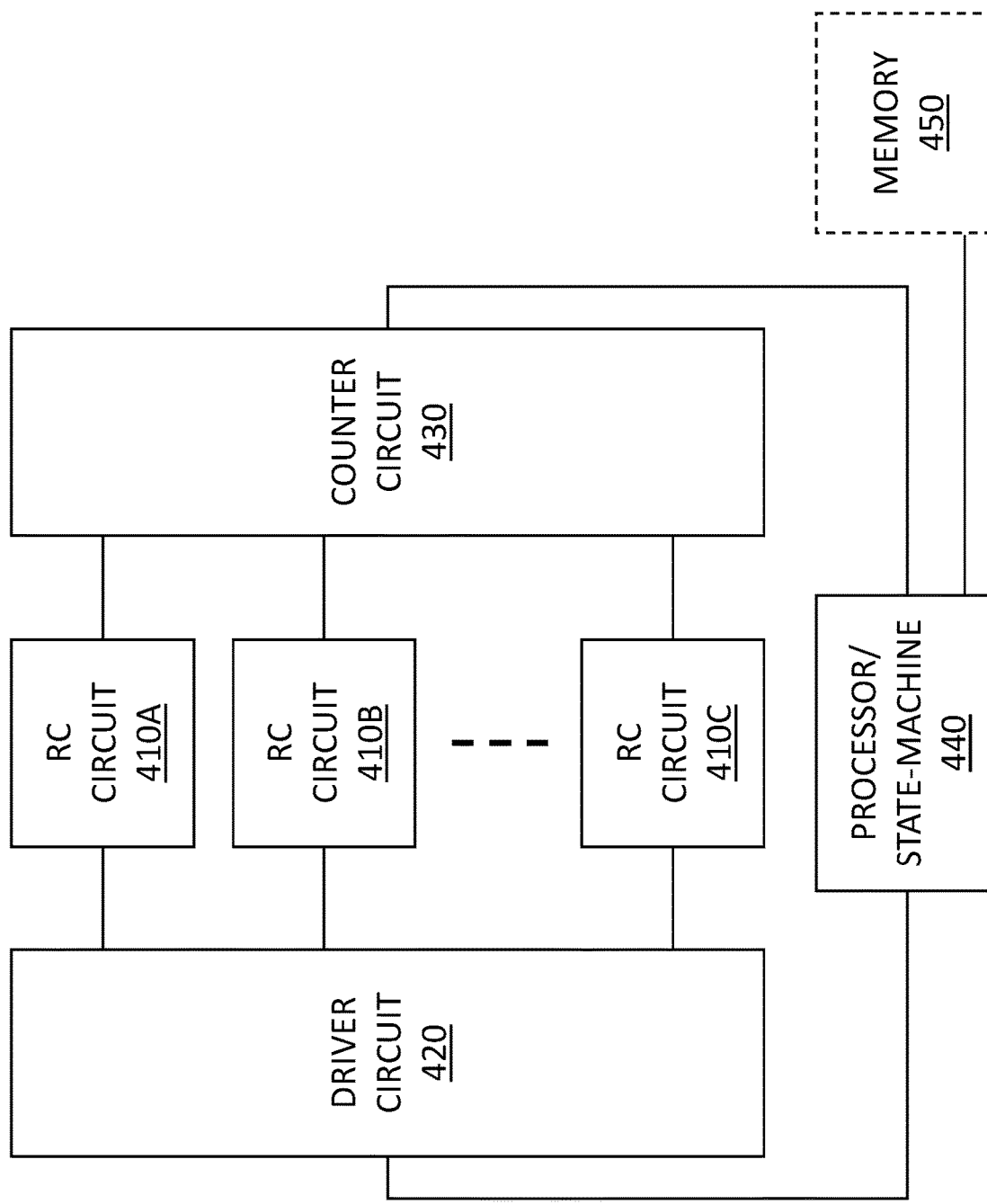
FIG. 4 is a block diagram of an anti-tampering system according to an implementation of the present disclosure.

FIG. 4 is a block diagram of an anti-tampering system (i.e., system) according to an implementation of the present disclosure. The system 400 includes a plurality of resistor-capacitor circuits 410A, 410B, 410C. The system 400 also includes a driver circuit 420 that is configured to apply an input signal to each of the resistor-capacitor (RC) circuits 410A, 410B, 410C and a counter circuit 430 that is configured to receive an output signal from each of the resistor-capacitor circuits 410A, 410B, 410C in response to the input signal. The counter circuit 430 may be further configured to measure, based on at least one criterion, times associated with the output signals. The measured times are correlated with (e.g., equal) respective time-constants of the resistor-capacitor circuits. The one or more criteria may include a threshold to start the counter (e.g., input signal transitions from LOW to HIGH) and a threshold to stop the counter (e.g., output signal matches a predetermined value). The system may further include a processor 440. The processor 440 can be configured by software instructions (i.e., an application) to coordinate and control the measurements of the times and to detect chip tampering based on the measured times.

The processor 440 may be embodied variously to carry out the functions described above. For example, the processor may be implemented as a microprocessor, a controller, a state-machine, or logic circuitry. The processor may communicate with and utilize a memory 450. For example, the memory 450 may be a non-transitory computer readable medium configured to store the software instructions, measurement criteria, and results from current and past measurements. In a possible implementation the anti-tampering system includes a state-machine in place of the processor (i.e., the processor is implemented as a state-machine). In another possible implementation the anti-tampering system includes a processor and a stat-machine.

The processor 440 may be configured to detect chip tampering using a variety of algorithms. For example, the measured times may be compared to detect tampering. In the detection by relative comparison approach, it can be assumed that all the resistor-capacitor circuits 410A, 410B, 410C are fabricated to have approximately the same time-constant. The processor is configured to compare the measured times to determine if one or more measured time is different (e.g., by a threshold amount) from a majority of the measured times. In another example, the measured times may be compared to a reference time. In the detection by fixed comparison approach, the processor may be configured to compare each measured time to a predetermined time and detect tampering when a measured time deviates from the predetermined time (e.g., by a threshold amount). While either approach may be used, the detection by relative comparison can offer some advantages. For example, variations (e.g., due to aging, temperature, etc.) that affect all the resistor-capacitor circuits may not affect the detection. Additionally, no reference times need to be measured and stored.

As mentioned, the processor 440 may be configured to take an action based on the detection of chip tampering. For example, upon detecting chip tampering the processor may be configured to alter a function of the chip (e.g., shutdown, transmit an alert, etc.) or may alter/delete sensitive data (e.g., stored in a memory 450 of the system).

Figure 5:
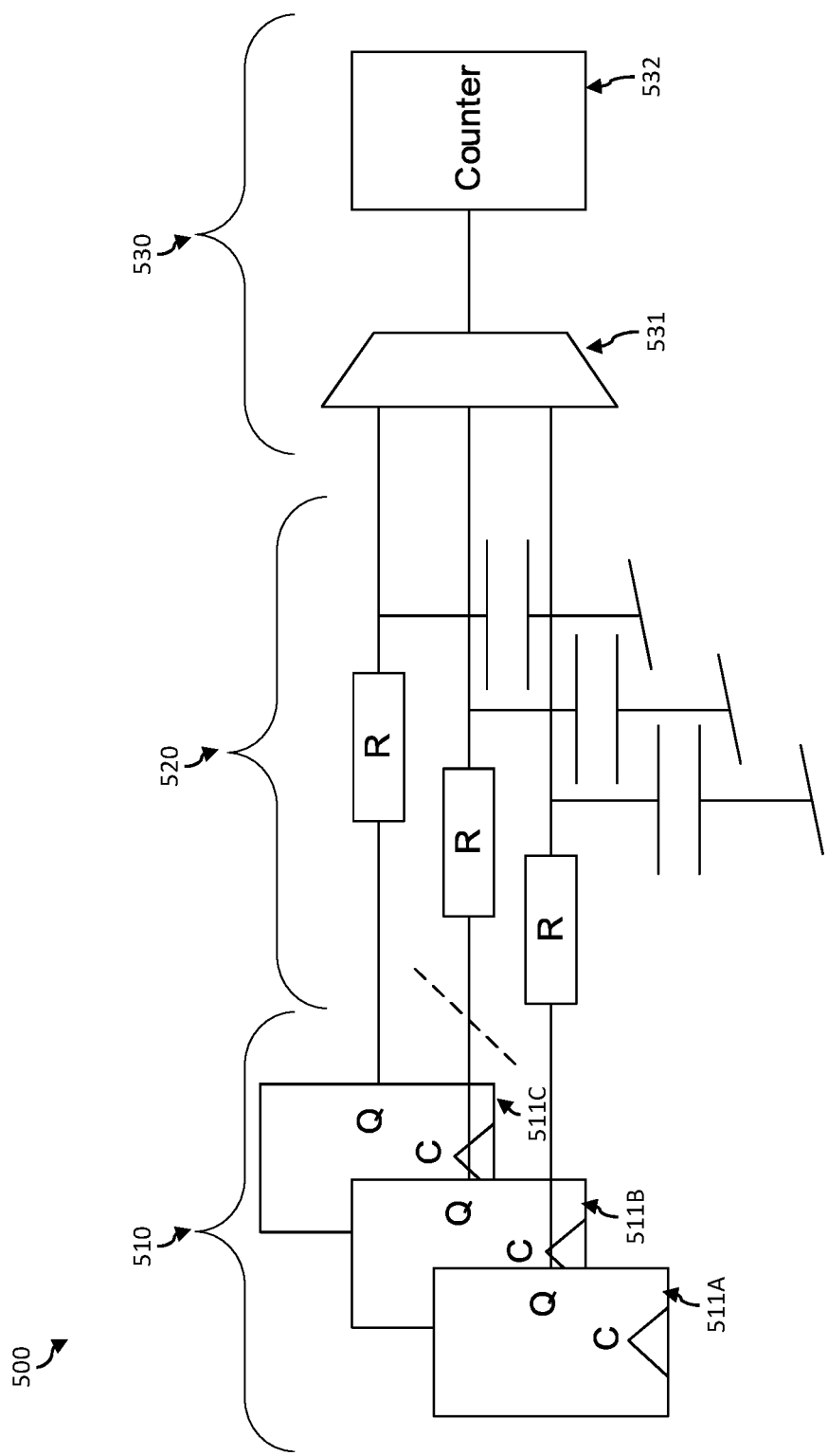
FIG. 5 schematically illustrates a first possible implementation of an anti-tampering circuit according to the present disclosure.

FIG. 5 schematically illustrates a first possible implementation of an anti-tampering circuit. The anti-tampering circuit 500 includes a driver circuit 510 coupled to inputs of a plurality of resistor-capacitor circuits 520, while outputs of the plurality of resistor-capacitor circuits 520 are coupled to a counter circuit 530. The driver circuit 510 includes at least one digital-signal source 511A, 511B, 511C. The digital-signal sources 511A, 511B, 511C are configured to generate input signals that each include a signal-change, such as a digital transition between a first signal level (e.g., LOW) and a second signal level (e.g., HIGH). The digital signal sources can each be implemented as a latch or a flip-flop. Alternatively, a clock may provide the signal-change (e.g., LOW/HIGH, HIGH/LOW) according to a test protocol to determine if tampering of a resistor-capacitor circuit 520 has occurred. The test protocol may include times to test the resistor-capacitor circuit for tampering and may further specify times (during each test) for charging and discharging the resistor capacitor circuit to measure a time-constant of the resistor-capacitor circuit. Each resistor-capacitor circuit is configured to delay (e.g., slow, LP filter) the signal change by an amount that corresponds to the time constant (i.e., RC) of the resistor-capacitor circuit. The counter circuit 530 includes an output-multiplexer 531 that is configured to route an output signals from the plurality of resistor-capacitor circuits to a counter 532 based on a state of the output-multiplexer. For example, the output-multiplexer 531 may be set in a first state (e.g., by a selector signal) to output an output signal from a first resistor-capacitor circuit to the counter, set in a second state to output an output signal from a second resistor-capacitor circuit to the counter, and so on. The counter circuit 530 also includes a counter 532 that can be triggered to start counting based on a first event (e.g., the signal-change of the input signal) and triggered to stop counting based on a second event (e.g., the output signal matching a value). The counter 532 can output a count that corresponds to a time measurement.

Figure 6:
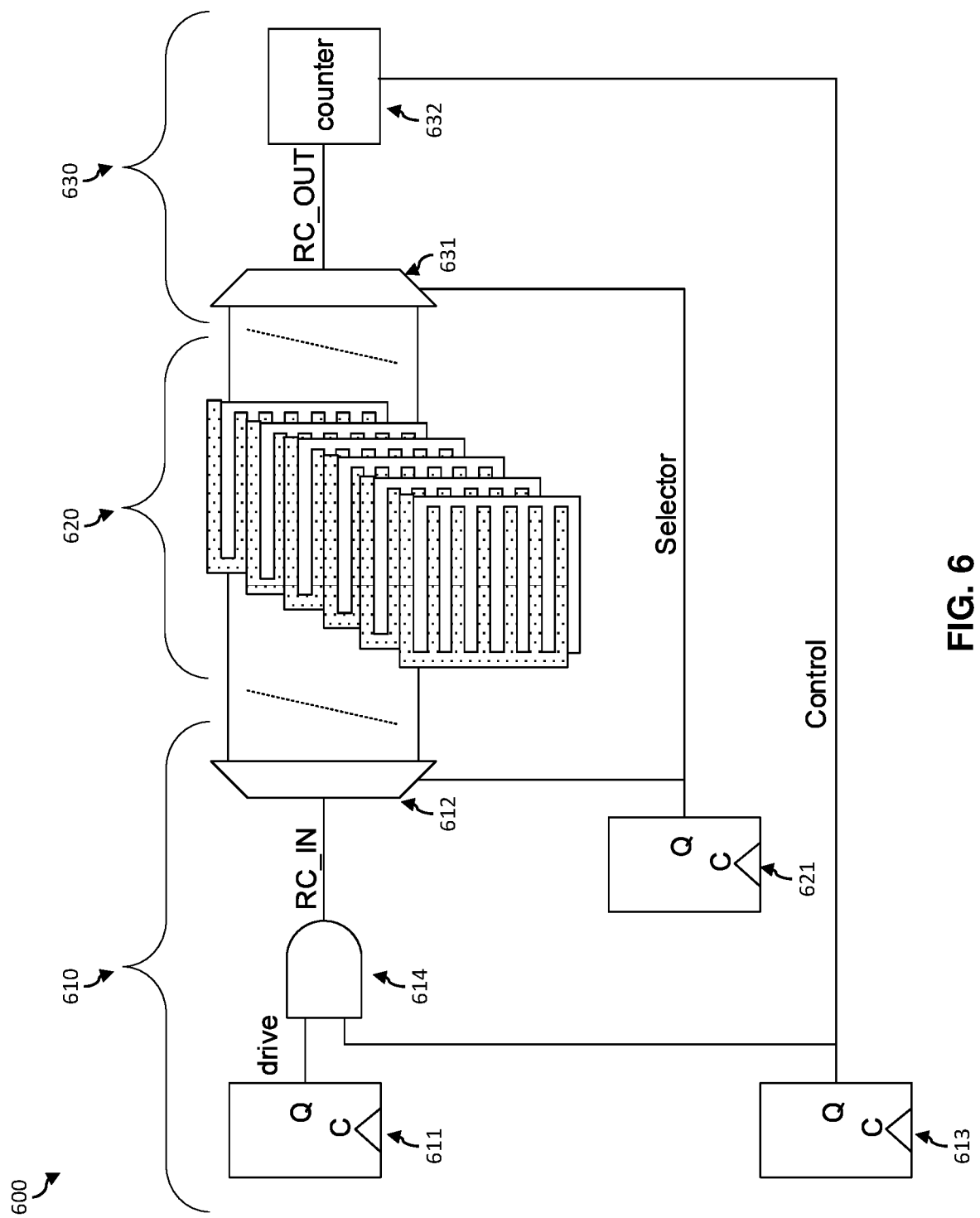
FIG. 6 schematically illustrates a second possible implementation of an anti-tampering circuit according to the present disclosure.

FIG. 6 schematically illustrates a second possible implementation of an anti-tampering circuit 600. The anti-tampering circuit 600 includes a driver circuit 610 coupled to inputs of a plurality of resistor-capacitor circuits 620, while outputs of the plurality of resistor-capacitor circuits 620 are coupled to a counter circuit 630. The driver circuit 610 can include an input-multiplexer 612 that is configured to route an input signal (RC_IN) from a digital-signal source 611 to an input of a resistor-capacitor circuit based on a state of the input-multiplexer 612. Alternatively, the input-multiplexer is not included, and each resistor-capacitor circuit is driven independently (e.g., in parallel) by a corresponding driver circuit. The counter circuit 630 can include an output-multiplexer 631 that is configured to route an output signal (RC_OUT) from an output of a resistor-capacitor circuit to the counter 632 based on a state of the output-multiplexer 631. Alternatively, the output-multiplexer is not included, and each resistor-capacitor circuit transmits an output independently (e.g., in parallel) to a corresponding counter. The states of the input-multiplexer and the output-multiplexer can be controlled by a selector signal (selector) generated by a selector source 621, which can be implemented as a latch or a flip-flop. The counter may be started (i.e., triggered) at the same time as a transition of an input signal (e.g., from LOW to HIGH) through the use of a control signal (control) from a control source 613 and a logic gate (e.g., AND gate) 614.

Figure 7A:
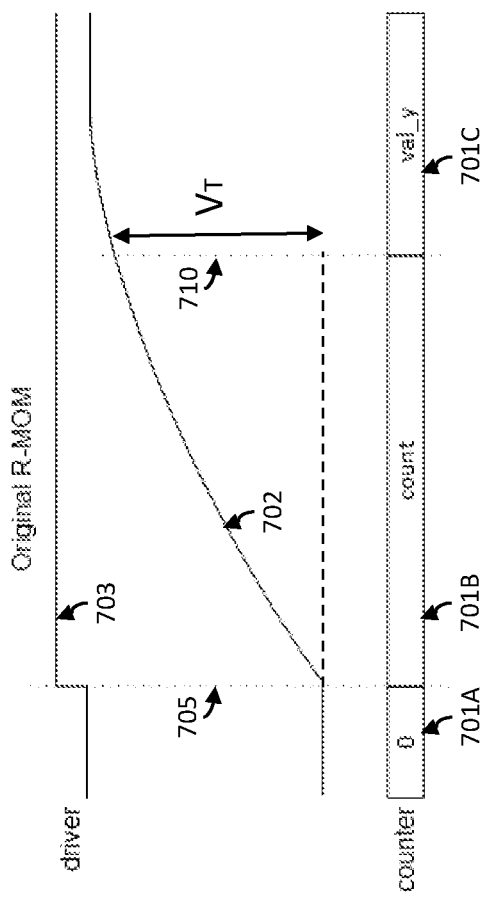
FIG. 7A is a time-based graph of an output signal of a resistor-capacitor circuit before tampering according to a possible implementation of the present disclosure.

FIG. 7A is a time-based graph of an output signal of a resistor-capacitor circuit (R-MOM) before tampering according to a possible implementation of the present disclosure. In the graph, the states of a counter are shown below an input signal 703 and an output signal 702. The counter is in a zero-state 701A before a start time 705 at which the input signal from the driver transitions from a LOW level to a HIGH level. After the start time 705, the counter enters a count-state 701B (count), during which it counts at a fixed rate. The counter continues counting until a stop time 710 when the output signal 702 reaches a threshold value or changes by a threshold amount ($V_T$). After the stop time, the counter enters a fixed-state 701C in which it outputs a value (val_y) that corresponds to a time-constant of the R-MOM before tampering.

Figure 7B:
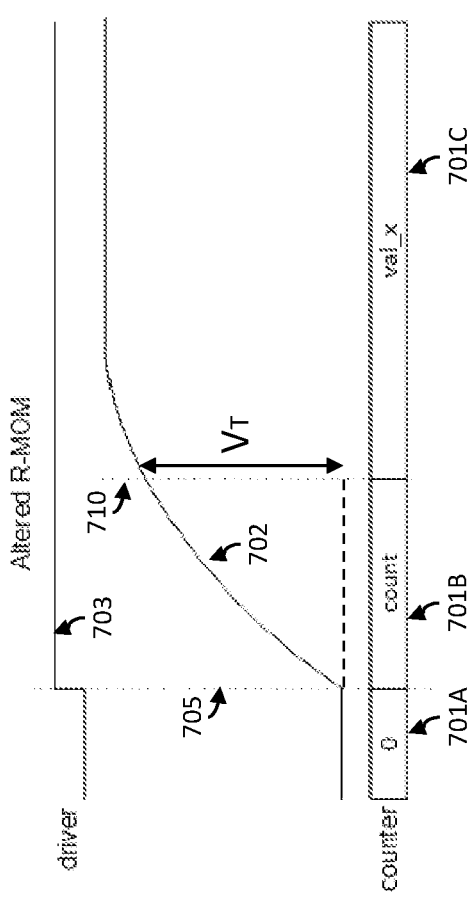
FIG. 7B is a time-based graph of an output signal of a resistor-capacitor circuit after tampering according to a possible implementation of the present disclosure.

FIG. 7B is a time-based graph of an output signal of a resistor-capacitor circuit after tampering according to a possible implementation of the present disclosure. In the graph, the states of the counter are shown below an input signal 703 and an output signal 702. The counter is in a zero-state 701A before a start time 705 at which the input signal from the driver transitions from a LOW level to a HIGH level. After the start time 705, the counter enters a count-state 701B (count), during which it counts at a fixed rate. The counter continues counting until a stop time 710 when output signal 702 reaches a threshold value or changes by a threshold amount ($V_T$). After the stop time, the counter enters a fixed-state 701C in which it outputs a value (val_x) that corresponds to a time-constant of the R-MOM after tampering. The count returned (i.e., the measured time) before and after tampering may be different based on a change in capacitance in the R-MOM (i.e., val_y≠val_x). For example, a hole in the R-MOM may reduce the capacitance thereby reducing the time-constant after tampering.

Figure 8:
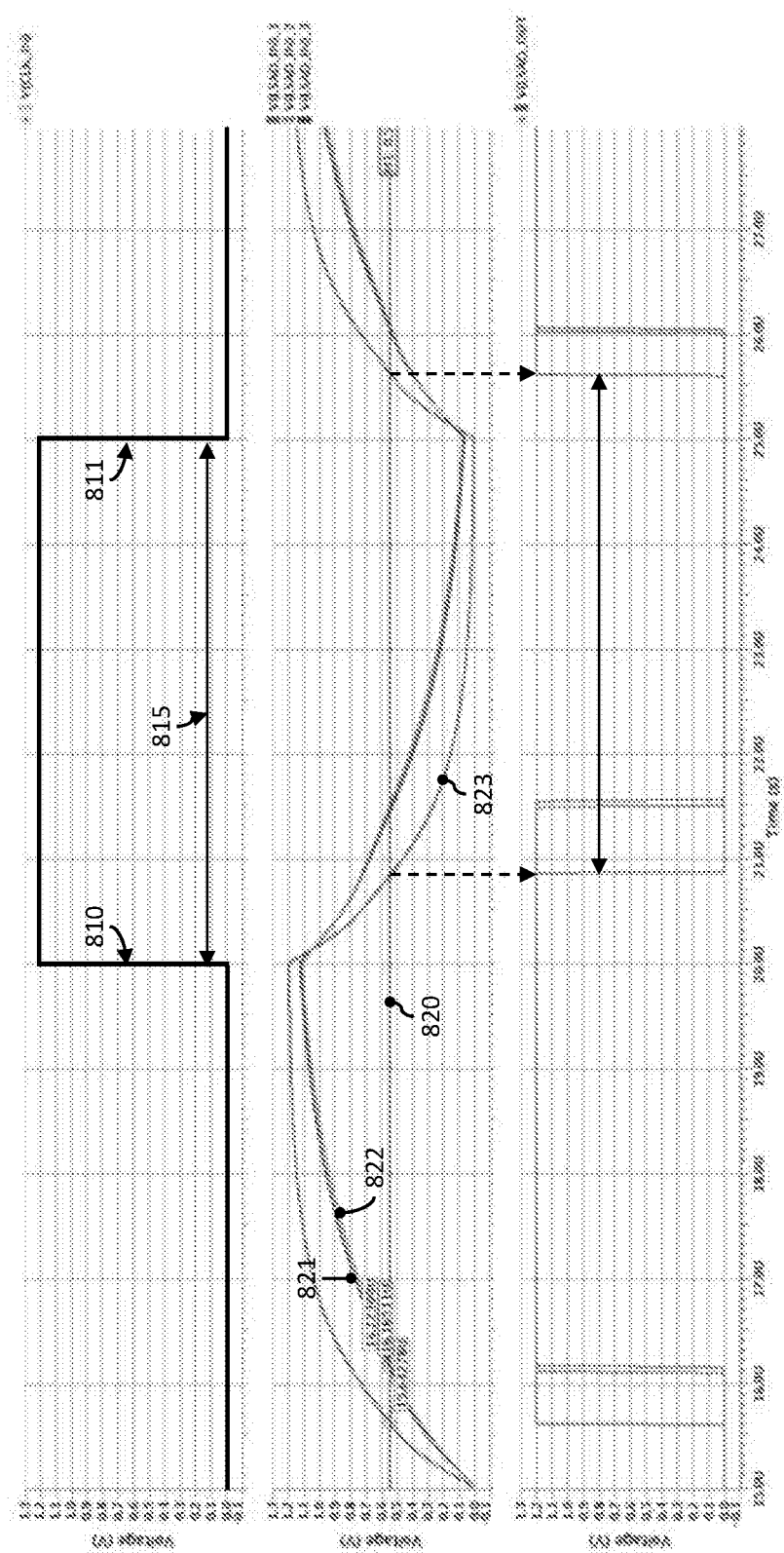
FIG. 8 includes time-based graphs of signals from an anti-tampering system according to an implementation of the present disclosure.

FIG. 8 includes time-based graphs of signals from an anti-tampering system according to an implementation of the present disclosure. As merely an example, the signals illustrate an alternate way to determine measured times and further illustrate how a detection by relative comparison may be carried out. An input signal is shown as having a first transition 810 followed (after a period 815) by a second transition 811. Three output signals are also shown. A first output signal 821 is from an R-MOM that has zero (0) percent (%) tampering. A second output signal 822 is from an R-MOM that has 5% tampering. A third output signal 823 is from an R-MOM that has 50% tampering. The tampering percentage of a metal-oxide-metal capacitor having interdigitated electrodes separated by an oxide may be the number (as a percentage) of finger portions shorted or disconnected due to tampering.

Each output signal may be compared to a threshold level 820 to generate a respective counter ON/OFF signal (e.g., for a counter). For example, while an output signal is above the threshold level the counter ON/OFF signal may be a high level (i.e., HIGH) and while the output signal is below the threshold level, the counter ON/OFF signal may be a low level (i.e., LOW). A counter may be configured to count only when the counter ON/OFF signal is LOW. Due to the differences in capacitance created by tampering, each count resulting from each counter ON/OFF signal is different. For example, a first count for a 0% altered MOM was 38, a second count for a 5% altered MOM was 36, and a third count for a 50% altered MOM was 20. The graphs show that the amount of tampering may be characterized and that more tampering yields more of a count difference. Accordingly, tampering may be detected when the difference of a count is large. For example, when the difference between a count and an average count is above a threshold, tampering may be detected for the MOM associated with the count outlier.

FIG. 9 is a flowchart for a method for detecting chip tampering according to an implementation of the present disclosure. The method 900 includes probing 910 a resistor-capacitor circuit with an input signal and receiving 920 a corresponding output signal from the resistor-capacitor circuit. The method further includes measuring 930 a time that the output signal matches at least one criterion. For example, a counter may be triggered to count while the output signal is above or below a threshold. After the time is measured, the method may further include selecting 940 additional resistor-capacitor circuits (e.g., one not yet probed) and repeating the probing 910, the receiving 920, and the measuring 930. This process may be repeated until times from all of the resistor-capacitor circuits have been measured. The method further includes detecting 950 chip tampering based on the times. For example, the method may further include comparing times measured for each resistor-capacitor circuit to obtain a result (e.g., a difference from a mean) and determining chip tampering based on the result.

In the specification and/or figures, typical embodiments have been disclosed. The present disclosure is not limited to such exemplary embodiments. The use of the term "and/or" includes any and all combinations of one or more of the associated listed items. The figures are schematic representations and so are not necessarily drawn to scale. Unless otherwise noted, specific terms have been used in a generic and descriptive sense and not for purposes of limitation.

Unless defined otherwise, all technical and scientific terms used herein have the same meaning as commonly understood by one of ordinary skill in the art. Methods and materials similar or equivalent to those described herein can be used in the practice or testing of the present disclosure. As used in the specification, and in the appended claims, the singular forms "a," "an," "the" include plural referents unless the context clearly dictates otherwise. The term "comprising" and variations thereof as used herein is used synonymously with the term "including" and variations thereof and are open, non-limiting terms. The terms "optional" or "optionally" used herein mean that the subsequently described feature, event or circumstance may or may not occur, and that the description includes instances where said feature, event or circumstance occurs and instances where it does not. Ranges may be expressed herein as from "about" one particular value, and/or to "about" another particular value. When such a range is expressed, an aspect includes from the one particular value and/or to the other particular value. Similarly, when values are expressed as approximations, by use of the antecedent "about," it will be understood that the particular value forms another aspect. It will be further understood that the endpoints of each of the ranges are significant both in relation to the other endpoint, and independently of the other endpoint.

Some implementations may be implemented using various semiconductor processing and/or packaging techniques. Some implementations may be implemented using various types of semiconductor processing techniques associated with semiconductor substrates including, but not limited to, for example, Silicon (Si), Gallium Arsenide (GaAs), Gallium Nitride (GaN), Silicon Carbide (SiC) and/or so forth.

While certain features of the described implementations have been illustrated as described herein, many modifications, substitutions, changes and equivalents will now occur to those skilled in the art. It is, therefore, to be understood that the appended claims are intended to cover all such modifications and changes as fall within the scope of the implementations. It should be understood that they have been presented by way of example only, not limitation, and various changes in form and details may be made. Any portion of the apparatus and/or methods described herein may be combined in any combination, except mutually exclusive combinations. The implementations described herein can include various combinations and/or sub-combinations of the functions, components and/or features of the different implementations described.

The invention claimed is:

1. A chip, comprising:
an integrated circuit disposed on a first chip layer, the integrated circuit including a plurality of protected areas;
a plurality of resistor-capacitor circuits, wherein each resistor-capacitor circuit of the plurality of resistor-capacitor circuits includes a capacitor disposed on a second chip layer that at least partially covers a corresponding protected area of the plurality of protected areas and wherein each capacitor of the plurality of resistor-capacitor circuits is configured to change a time-constant of a corresponding resistor-capacitor circuit upon being physically altered; and
an anti-tampering circuit configured to sense a plurality of time-constants of the plurality of resistor-capacitor circuits to determine that at least one capacitor of a plurality of capacitors of the plurality of resistor-capacitor circuits has been physically altered.

2. The chip according to claim 1, wherein a resistor-capacitor circuit of the plurality of resistor-capacitor circuits further includes:
a resistor coupled between an input and an output of the resistor-capacitor circuit; and
a capacitor having a first electrode coupled to the output of the resistor-capacitor circuit, a second electrode coupled to a ground voltage, and an insulator disposed between the first electrode and the second electrode.

3. The chip according to claim 2, wherein:
the first electrode has a first plurality of finger portions;
the second electrode has a second plurality of finger portions, the first plurality of finger portions interdigitated with and within a same plane as the second plurality of finger portions; and
the insulator includes an oxide layer disposed between interdigitated finger portions.

4. The chip according to claim 1, wherein the anti-tampering circuit includes:
a driver circuit coupled to an input of a resistor-capacitor circuit of the plurality of resistor-capacitor circuits, the driver circuit configured to generate an input signal to probe a time-constant of the resistor-capacitor circuit; and
a counter circuit coupled to an output of the resistor-capacitor circuit, the counter circuit configured to receive an output signal from the resistor-capacitor circuit in response to the input signal, the output signal changing according to the time-constant of the resistor-capacitor circuit.

5. The chip according to claim 4, wherein the driver circuit includes:
a digital-signal source configured to generate the input signal including a digital transition between a first signal level and a second signal level.

6. The chip according to claim 5, wherein the digital-signal source is a latch or a flip-flop.

7. The chip according to claim 1, wherein the anti-tampering circuit includes:
a driver circuit that includes an input-multiplexer configured to route an input signal from a digital-signal source to an input of a particular resistor-capacitor circuit of the plurality of resistor-capacitor circuits based on a state of the input-multiplexer.

8. The chip according to claim 7, wherein the anti-tampering circuit includes:
a counter circuit that includes an output-multiplexer configured to route an output signal from the particular resistor-capacitor circuit of the plurality of resistor-capacitor circuits to a counter based on a state of the output-multiplexer.

9. The chip according to claim 8, wherein the counter is configured to measure a time that the output signal matches one or more criteria, the time corresponding to the time-constant of the particular resistor-capacitor circuit of the plurality of resistor-capacitor circuits.

10. A system comprising:
an integrated circuit;
a plurality of resistor-capacitor circuits that each include a capacitor covering a portion of the integrated circuit, each capacitor configured to change a time-constant of a corresponding resistor-capacitor circuit when the capacitor is physically altered;
a driver circuit configured to apply an input signal to each of the plurality of resistor-capacitor circuits;
a counter circuit configured to measure a time that each output signal from each of the plurality of resistor-capacitor circuits matches at least one criterion; and
a processor configured by software instructions to detect chip tampering based on the times associated with the plurality of resistor-capacitor circuits measured by the counter circuit.

11. The system according to claim 10, wherein the capacitor is a metal-oxide-metal capacitor having interdigitated electrodes separated by an oxide.

12. The system according to claim 10, wherein to detect chip tampering based on the times measured by the counter circuit includes:

comparing the times that the plurality of resistor-capacitor circuits match the least one criterion.

13. The system according to claim 10, wherein the processor is further configured by software instructions to alter data stored in a memory of the system in response to detecting chip tampering.

14. The system according to claim 10, wherein the driver circuit includes:
a digital-signal source configured to generate the input signal including a digital transition between a first signal level and a second signal level.

15. The system according to claim 14, wherein the digital-signal source is a latch or a flip flop.

16. The system according to claim 10, wherein the driver circuit includes an input-multiplexer configured to route the input signal from a digital-signal source to an input of one of the plurality of resistor-capacitor circuits based on a state of the input-multiplexer.

17. The system according to claim 10, wherein the counter circuit includes an output-multiplexer configured to route an output signal from one of the plurality of resistor-capacitor circuits to the counter circuit based on a state of the output-multiplexer.

18. The system according to claim 17, wherein the time corresponds to a time constant of the one of the plurality of resistor-capacitor circuits.

* * * * *